(12) United States Patent
Esposito et al.

(10) Patent No.: US 9,118,132 B2
(45) Date of Patent: Aug. 25, 2015

(54) VACUUM COMPATIBLE HIGH-DENSITY ELECTRICAL INTERCONNECT SYSTEM

(75) Inventors: Gerard A. Esposito, Chelmsford, MA (US); Dennis P. Bowler, Sudbury, MA (US)

(73) Assignee: BAE Systems Information and Electronic Systems Integration, Nashua, NH (US)

( * ) Notice: Subject to any disclaimer, the term of this patent is extended or adjusted under 35 U.S.C. 154(b) by 610 days.

(21) Appl. No.: 13/603,447

(22) Filed: Sep. 5, 2012

(65) Prior Publication Data

US 2013/0063603 A1   Mar. 14, 2013

Related U.S. Application Data

(60) Provisional application No. 61/532,272, filed on Sep. 8, 2011.

(51) Int. Cl.
*H01L 31/0203* (2014.01)
*G01J 5/04* (2006.01)
*H01R 13/24* (2006.01)
*H01L 31/02* (2006.01)
*H01R 12/71* (2011.01)

(52) U.S. Cl.
CPC ............... *H01R 13/24* (2013.01); *G01J 5/045* (2013.01); *H01L 31/02002* (2013.01); *H01L 31/0203* (2013.01); *H01R 12/718* (2013.01)

(58) Field of Classification Search
CPC . G01J 5/045; H01L 31/02002; H01L 31/0203
See application file for complete search history.

(56) References Cited

U.S. PATENT DOCUMENTS

| | | | |
|---|---|---|---|
| 7,771,114 B2 * | 8/2010 | Kiefer et al. | 374/152 |
| 8,487,257 B2 * | 7/2013 | Giebeler et al. | 250/338.3 |
| 8,575,550 B2 * | 11/2013 | Wright | 250/338.4 |
| 8,822,256 B1 * | 9/2014 | Yang et al. | 438/57 |

* cited by examiner

*Primary Examiner* — Evan Pert
(74) *Attorney, Agent, or Firm* — Prakash Nama; Daniel J. Long

(57) ABSTRACT

A vacuum compatible high-density electrical interconnect system for use in a vacuum environment is disclosed. In one embodiment, the vacuum compatible high-density electrical interconnect system includes a vacuum compatible base plate, a vacuum compatible printed wiring board (PWB) disposed on the vacuum compatible base plate and a vacuum compatible interposer module disposed in the vacuum compatible base plate. Further, the vacuum compatible PWB includes a plurality of components on a front side of the vacuum compatible PWB and a plurality of associated pads on a back side of the vacuum compatible PWB. In one exemplary embodiment, the vacuum compatible interposer module is disposed in the vacuum compatible base plate such that it operatively connects to the plurality of associated pads on the back side of the vacuum compatible PWB and further operatively connects to a plurality of pads of an external device that is disposed outside the vacuum environment.

10 Claims, 2 Drawing Sheets

VACUUM COMPATIBLE HIGH-DENSITY ELECTRICAL INTERCONNECT SYSTEM

CROSS-REFERENCE TO RELATED APPLICATION

This Application claims rights under 35 USC §119(e) from U.S. application Ser. No. 61/532,272 filed Sep. 8, 2011, the contents of which are incorporated herein by reference.

BACKGROUND OF THE INVENTION

1. Field of the Invention

The present invention relates to electrical connections and more specifically to high-density electrical connections in a vacuum environment.

2. Brief Description of Related Art

One of the most difficult challenges posed by a high resolution imaging equipment is management of very high-density electrical connections required to operate many optical sensors used for such applications. The high resolution imaging equipment typically comprises a large number of coordinated optical sensors, such as focal plane arrays, operating in a small area. Each of these optical sensors necessitates a plurality of electrical connections to supply power and transmit input and output data.

Traditional electrical connections require lengths of wire or other conductive materials, which run along a printed circuit board (PCB) and occupy valuable space. This inefficient usage of available space severely limits the number of electrical connections per area and consequently limits the performance of high resolution imaging systems.

Further, due to high equipment cost and changing data capture requirements, the imaging systems commonly require that the aforementioned optical sensors and other circuitry be easily changed or replaced through interconnect systems. Furthermore, these interconnect systems are required in order to segregate modular portions of the imaging systems during assembly and manufacturing processes. Traditional interconnect systems use interposer connectors. Unfortunately, these interconnect systems are most commonly made from plastics or other organics-containing materials, such as flame retardant 4 (FR4). In normal non-cryogenic operating conditions, typically, it is not difficult to provide any needed thermal cooling to these imaging systems. However, when these imaging systems are housed in a cryogenic operating condition, it becomes difficult to provide the needed thermal cooling, as the plastics and other organics used in the interconnect systems may absorb moisture and can outgas and are therefore, not suitable for use in the vacuum environment required for many imaging applications, such as infrared (IR) imaging.

SUMMARY OF THE INVENTION

A vacuum compatible high-density electrical interconnect system is disclosed. According to one aspect of the present subject matter, the vacuum compatible high-density electrical interconnect system for use in a vacuum environment includes a vacuum compatible base plate, at least one vacuum compatible printed wiring board (PWB) disposed on the vacuum compatible base plate and at least one vacuum compatible interposer module disposed in the vacuum compatible base plate. Further, the at least one vacuum compatible PWB includes a plurality of components on a front side of the at least one vacuum compatible PWB and a plurality of associated pads on a back side of the at least one vacuum compatible PWB. In one embodiment, the at least one vacuum compatible interposer module is disposed in the vacuum compatible base plate such that it operatively connects to the plurality of associated pads on the back side of the at least one vacuum compatible PWB and further operatively connects to a plurality of pads of an external device that is disposed outside the vacuum environment.

According to another aspect of the present subject matter, a thermal imaging camera includes a vacuum chamber, a vacuum compatible window disposed in the vacuum chamber and configured to receive infrared (IR) light, the vacuum compatible base plate disposed in the vacuum chamber, the at least one vacuum compatible PWB disposed on the vacuum compatible base plate and the at least one vacuum compatible interposer module disposed in the vacuum compatible base plate. Further, the at least one vacuum compatible PWB includes the plurality of components on the front side of the at least one vacuum compatible PWB and the plurality of associated pads on the back side of the at least one vacuum compatible PWB. In one embodiment, the at least one vacuum compatible interposer module is disposed in the vacuum compatible base plate such that it operatively connects to the plurality of associated pads on the back side of the at least one vacuum compatible PWB and further operatively connects to the plurality of pads of the external device that is disposed outside the vacuum environment.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

DETAILED DESCRIPTION OF THE INVENTION

The exemplary embodiments described herein in detail for illustrative purposes are subject to many variations in structure and design.

The terms "printed circuit board (PCB)" and "printed wiring board (PWB)" are used interchangeably throughout the document.

Figure 1:
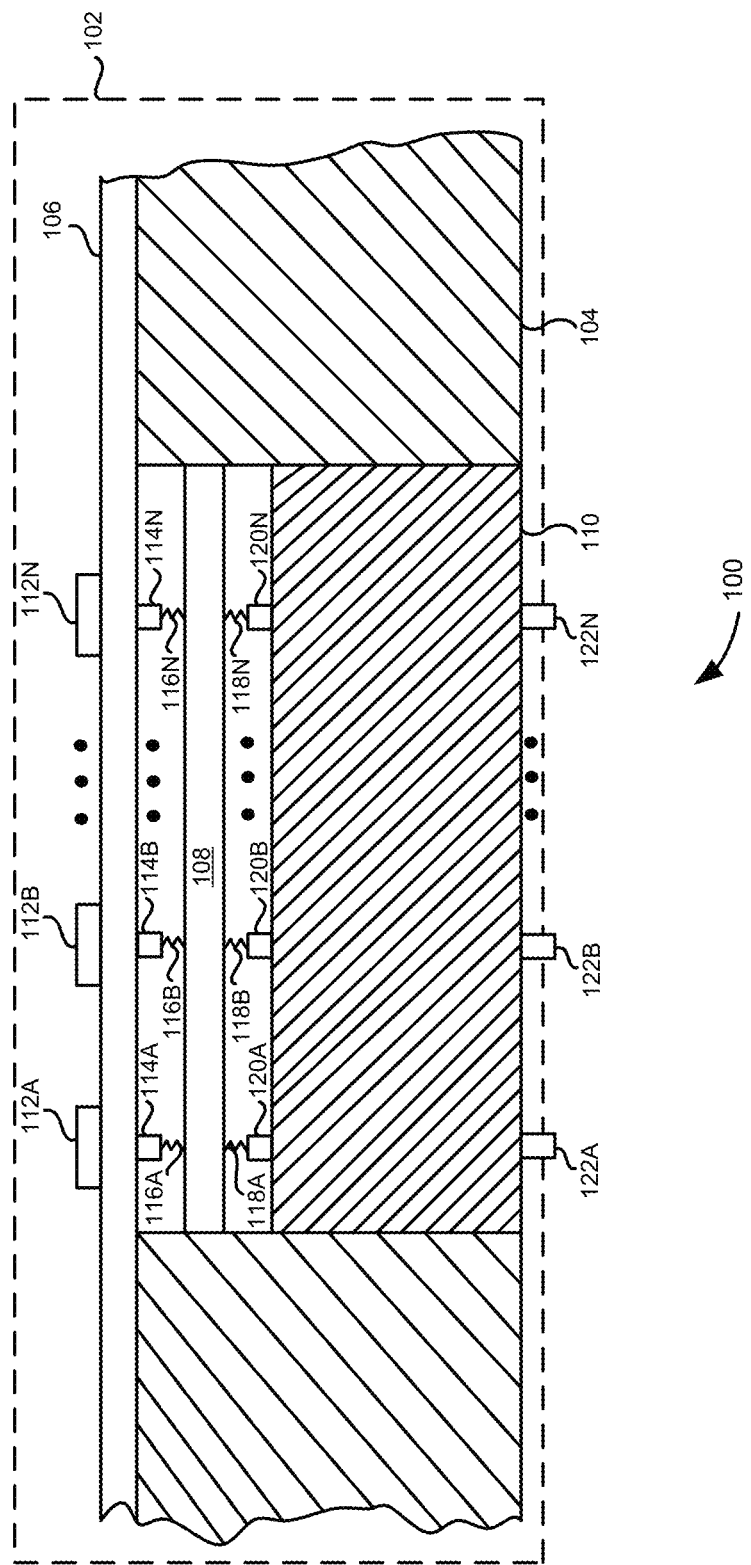
FIG. 1 is a cross sectional view of a vacuum compatible high-density electrical interconnect system, according to an embodiment of the present subject matter.

FIG. 1 is a cross sectional view 100 of a vacuum compatible high-density electrical interconnect system, according to an embodiment of the present subject matter. As shown in the FIG. 1, the vacuum compatible high-density electrical interconnect system includes a hermetically sealed chamber 102. Further, the hermetically sealed chamber 102 includes a vacuum compatible base plate 104, a vacuum compatible PWB 106 disposed on the vacuum compatible base plate 104, a vacuum compatible interposer module 108 disposed in the vacuum compatible base plate 104 and a vacuum compatible feed through module 110 disposed in the vacuum compatible base plate 104. For example, the vacuum compatible base plate 104, the vacuum compatible PWB 106, the vacuum compatible interposer module 108 and the vacuum compatible feed through module 110 are made of materials, such as metal, glass, ceramic and the like.

Further, the vacuum compatible PWB 106 includes a plurality of components 112A-N on a front side of the vacuum compatible PWB 106 and a plurality of associated pads 114A-N on a back side of the vacuum compatible PWB 106. Furthermore, the vacuum compatible interposer module 108 includes a first plurality of spring connectors 116A-N on a first side of the vacuum compatible interposer module 108 and a second plurality of spring connectors 118A-N on a second side of the vacuum compatible interposer module 108. In addition, the vacuum compatible feed through module 110 includes a first plurality of pins 120A-N on a first side of the vacuum compatible feed through module 110 and a second plurality of pins 122A-N on a second side of the vacuum compatible feed through module 110. For example, the first side of the vacuum compatible feed through module 110 is disposed directly across from the second side of the vacuum compatible feed through module 110.

In one embodiment, the vacuum compatible interposer module 108 is disposed in the vacuum compatible base plate 104 such that it operatively connects to the plurality of associated pads 114A-N on the back side of the vacuum compatible PWB 106 and further operatively connects to the plurality of pads of an external device that is disposed outside the vacuum environment. Particularly, the first plurality of spring connectors 116A-N are operatively connected to the plurality of associated pads 114A-N on the back side of the vacuum compatible PWB 106 and the second plurality of spring connectors 118A-N are configured to operatively connect to the plurality of pads of the external device. In one exemplary implementation, the vacuum compatible feed through module 110 is disposed in the vacuum compatible base plate 104 such that it operatively connects the second plurality of spring connectors 118A-N with the first plurality of pins 120A-N and further configured to operatively connect the second plurality of pins 122A-N to the plurality of pads of the external device.

In this embodiment, use of the first plurality of springs connectors 116A-N to interface with the vacuum compatible interposer module 108 and the plurality of associated pads 114A-N on the back side of the vacuum compatible PWB 106 allows for a space efficient method of directly connecting a large number of high-density electrical elements, rather than relying on space inefficient traditional connections. In an exemplary embodiment, it is contemplated that electronic devices, such as focal plane arrays would be connected to the vacuum compatible PCB 106 opposite to the plurality of associated pads 114A-N. The plurality of associated pads 114A-N interface with the first plurality of spring connectors 116A-N which then directly interface with the vacuum compatible interposer module 108. This compact, direct path to the vacuum compatible interposer module 108 maximizes the number of available connections over a predetermined area of the vacuum compatible PCB 106. In an exemplary embodiment, connection density is further maximized by sandwiching each vacuum compatible interposer module between two vacuum compatible PCBs so that the vacuum compatible interposer module can connect to two sets of electronic devices at the same time with a single connector.

Figure 2:
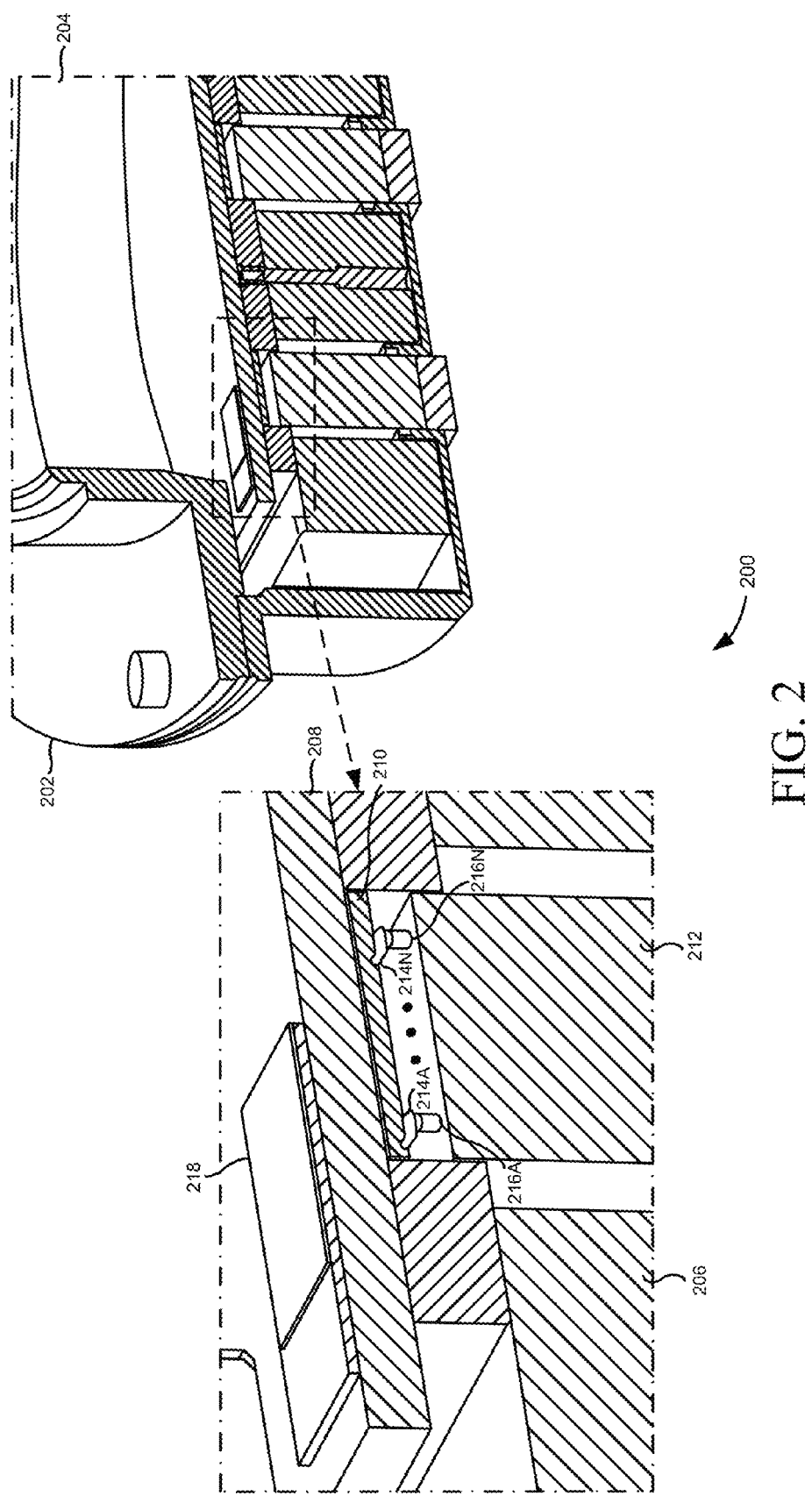
FIG. 2 is a cross sectional isometric view of the vacuum compatible high-density electrical interconnect system for a thermal imaging camera, such as shown in FIG. 1, according to an embodiment of the present subject matter.

Referring now to FIG. 2, which is another cross sectional isometric view 200 that illustrates the vacuum compatible high-density electrical interconnect system for a thermal imaging camera, such as shown in FIG. 1, according to an embodiment of the present subject matter. As shown in FIG. 2, the thermal imaging camera includes a vacuum chamber 202, a vacuum compatible window 204 disposed in the vacuum chamber 202 and configured to receive infrared (IR) light, a vacuum compatible base plate 206 disposed in the vacuum chamber 202, a vacuum compatible PWB 208 disposed on the vacuum compatible base plate 206, a vacuum compatible interposer module 210 disposed in the vacuum compatible base plate 206, a vacuum compatible feed through module 212 disposed in the vacuum compatible base plate 206 and a focal plane array 218 disposed in the vacuum chamber 202. For example, the vacuum compatible base plate 206, the vacuum compatible PWB 208, the vacuum compatible interposer module 210 and the vacuum compatible feed through module 212 are made of materials, such as metal, glass, ceramic and the like. Further, the vacuum compatible interposer module 210 includes a plurality of spring connectors 214A-N on a side of the vacuum compatible interposer module 210. Furthermore, the vacuum compatible feed through module 212 includes a plurality of pins 216A-N on a second side of the vacuum compatible feed through module 212.

In one embodiment, the vacuum compatible interposer module 210 is disposed in the vacuum compatible base plate 206 such that it operatively connects to the vacuum compatible PWB 208 and further operatively connects to the plurality of pads of the external device that is disposed outside the vacuum environment. Particularly, the plurality of spring connectors 214A-N are configured to operatively connect to the plurality of pads of the external device. In one exemplary implementation, the vacuum compatible feed through module 212 is disposed in the vacuum compatible base plate 206 such that it operatively connects the plurality of spring connectors 214A-N with the plurality of pins 216A-N and further configured to operatively connect to the plurality of pads of the external device.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A vacuum compatible high-density electrical interconnect system for use in a vacuum environment, comprising:
    a vacuum compatible base plate;
    at least one vacuum compatible printed wiring board (PWB) disposed on the vacuum compatible base plate, wherein the at least one vacuum compatible PWB includes a plurality of components on a front side of the at least one vacuum compatible PWB and a plurality of associated pads on a back side of the at least one vacuum compatible PWB; and
    at least one vacuum compatible interposer module disposed in the vacuum compatible base plate such that it operatively connects to the plurality of associated pads on the back side of the at least one vacuum compatible PWB and further operatively connects to a plurality of pads of an external device that is disposed outside the vacuum environment.

2. The system of claim 1, wherein the at least one vacuum compatible interposer module comprises a first plurality of spring connectors on a first side of the at least one vacuum compatible interposer module and a second plurality of spring connectors on a second side of the at least one vacuum compatible interposer module, wherein the first plurality of spring connectors are operatively connected to the plurality of associated pads on the back side of the at least one vacuum compatible PWB and wherein the second plurality of spring connectors are configured to operatively connect to the plurality of pads of the external device.

3. The system of claim 2, further comprising:
a vacuum compatible feed through module having a first plurality of pins on a first side of the vacuum compatible feed through module and a second plurality of pins on a second side of the vacuum compatible feed through module, wherein the first side of the vacuum compatible feed through module is disposed directly across from the second side of the vacuum compatible feed through module and wherein the vacuum compatible feed through module is disposed in the vacuum compatible base plate such that it operatively connects the second plurality of spring connectors with the first plurality of pins and further configured to operatively connect the second plurality of pins to the plurality of pads of the external device.

4. The system of claim 3, wherein the vacuum compatible feed through module is made of materials selected from the group consisting of metal, glass or ceramic.

5. The system of claim 1, wherein the at least one vacuum compatible PWB is made of materials selected from the group consisting of metal, glass or ceramic.

6. The system of claim 1, wherein the vacuum compatible base plate is made of materials selected from the group consisting of metal, glass or ceramic.

7. The system of claim 1, wherein the at least one vacuum compatible interposer module is made of materials selected from the group consisting of metal, glass or ceramic.

8. A thermal imaging camera, comprising:
a vacuum chamber;
a vacuum compatible window disposed in the vacuum chamber and configured to receive infrared (IR) light;
a vacuum compatible base plate disposed in the vacuum chamber;
at least one vacuum compatible printed wiring board (PWB) disposed on the vacuum compatible base plate, wherein the at least one vacuum compatible PWB includes a plurality of components on a front side of the at least one vacuum compatible PWB and a plurality of associated pads on a back side of the at least one vacuum compatible PWB; and
at least one vacuum compatible interposer module disposed in the vacuum compatible base plate such that it operatively connects to the plurality of associated pads on the back side of the at least one vacuum compatible PWB and further operatively connects to a plurality of pads of an external device.

9. The thermal imaging camera of claim 8, wherein the at least one vacuum compatible interposer module comprises a first plurality of spring connectors on a first side of the at least one vacuum compatible interposer module and a second plurality of spring connectors on a second side of the at least one vacuum compatible interposer module, wherein the first plurality of spring connectors are operatively connected to the plurality of associated pads on the back side of the at least one vacuum compatible PWB and wherein the second plurality of spring connectors are configured to operatively connect to the plurality of pads of the external device.

10. The thermal imaging camera of claim 9, further comprising:
a vacuum compatible feed through module having a first plurality of pins on a first side of the vacuum compatible feed through module and a second plurality of pins on a second side of the vacuum compatible feed through module, wherein the first side of the vacuum compatible feed through module is disposed directly across from the second side of the vacuum compatible feed through module and wherein the vacuum compatible feed through module is disposed in the vacuum compatible base plate such that it operatively connects the second plurality of spring connectors with the first plurality of pins and further configured to operatively connect the second plurality of pins to the plurality of pads of the external device.

* * * * *